United States Patent
Lim et al.

(10) Patent No.: US 9,318,359 B2
(45) Date of Patent: Apr. 19, 2016

(54) APPARATUS FOR SUBSTRATE TREATMENT AND HEATING APPARATUS

(71) Applicant: AP SYSTEMS INC., Hwaseong-Si, Gyeonggi-Do (KR)

(72) Inventors: Il-Hwan Lim, Seongnam-Si (KR); Jang-Woo Shim, Hwaseong-Si (KR); Chul-Soo Kim, Boryeong-Si (KR); Seung-Ae Choi, Hwaseong-Si (KR)

(73) Assignee: AP SYSTEMS INC. (KR)

( * ) Notice: Subject to any disclaimer, the term of this patent is extended or adjusted under 35 U.S.C. 154(b) by 393 days.

(21) Appl. No.: 13/886,261

(22) Filed: May 2, 2013

(65) Prior Publication Data

US 2013/0294756 A1 Nov. 7, 2013

(30) Foreign Application Priority Data

May 3, 2012 (KR) ................... 10-2012-0046713

(51) Int. Cl.
*F26B 3/30* (2006.01)
*F21V 7/00* (2006.01)
*H01L 21/67* (2006.01)
*H05B 3/00* (2006.01)
*F27B 17/00* (2006.01)

(52) U.S. Cl.
CPC ...... *H01L 21/67115* (2013.01); *F27B 17/0025* (2013.01); *H05B 3/0047* (2013.01)

(58) Field of Classification Search
None
See application file for complete search history.

(56) References Cited

U.S. PATENT DOCUMENTS

| 5,310,260 | A | * | 5/1994 | Schietinger et al. | 374/142 |
| 5,624,590 | A | * | 4/1997 | Fiory | 219/390 |
| 6,080,965 | A | | 6/2000 | Osawa | |
| 6,350,964 | B1 | * | 2/2002 | Boas et al. | 219/390 |
| 6,641,302 | B2 | * | 11/2003 | Li et al. | 374/130 |
| 6,717,158 | B1 | * | 4/2004 | Gat et al. | 250/492.2 |
| 2004/0037543 | A1 | * | 2/2004 | Kusuda et al. | 392/416 |
| 2004/0264950 | A1 | * | 12/2004 | Kusuda | 392/411 |
| 2006/0291832 | A1 | | 12/2006 | Ito | |
| 2011/0232677 | A1 | | 9/2011 | Liu et al. | |

FOREIGN PATENT DOCUMENTS

| CN | 2722290 | 8/2005 |
| JP | 2003209054 A | 7/2003 |
| KR | 20070109668 A | 11/2007 |
| KR | 20080032783 | 4/2008 |
| KR | 101073435 B1 | 10/2011 |

* cited by examiner

*Primary Examiner* — Thor Campbell (57) ABSTRACT

The present invention relates to an apparatus for heat-treating a substrate, and more particularly to an apparatus for substrate treatment to perform a heat treatment of a substrate for a flat panel display panel.

An apparatus for substrate treatment according to an embodiment of the present invention comprises a processing chamber having a substrate treatment space; a heating housing having a heating lamp that emits radiant energy and a reflecting block that reflects radiant energy emitted from the heating lamp; and a window that maintains a sealing between the processing chamber and the heating housing and transmits the radiant energy to a substrate.

27 Claims, 9 Drawing Sheets

APPARATUS FOR SUBSTRATE TREATMENT AND HEATING APPARATUS

TECHNICAL FIELD

The present invention relates to an apparatus for heat-treating a substrate, and more particularly to an apparatus for substrate treatment to perform a heat treatment of a substrate for a flat panel display panel.

BACKGROUND

In heat treatment processes (LTPS: Low Thermal Poly-Silicon, LITI: Laser Induced Thermal Imaging) for FPDs (Flat Panel Display: LCD, OLED, Flexible), an improvement in uniformity and productivity is required. In a LTPS process, oxide TFT technique is the matter of interest, instead of polysilicon crystallization TFT (Thin Film Transistor) using a heat source.

In general, a heat treatment process is applied to substrate heat oxidation and various annealing processes. Such a heat treatment process is performed using a heat source such as laser or tungsten halogen lamp. Currently, a heat treatment process using a laser heat source is applied in panels for flat panel displays (FPDs) including OLEDs (Organic Light Emitting Diodes). However, a heat treatment using a laser heat source allows for an instant heating of local region due to laser's nature, but there is a disadvantage that expensive laser generating equipments and complicate optical routes are required. Further, high maintenance costs are continuously needed.

For this reason, when using an oxide TFT substrate for panels of large area flat panel displays (FPDs), it has been suggested that a heat treatment should be performed using a tungsten halogen lamp used in conventional semiconductor heat treatment processes as a heat source for a heat treatment process. If a heat treatment of a substrate of a flat panel display panel is performed using a tungsten halogen lamp not laser, it is expected that more stable heat treatment would be performed in a large area substrate. However, when a heat treatment process for a large area substrate is performed using a tungsten halogen lamp as a heat source, there is a problem such as heat treatment uniformity, as exemplified in FIG. 3 and FIG. 4.

Figure 1:
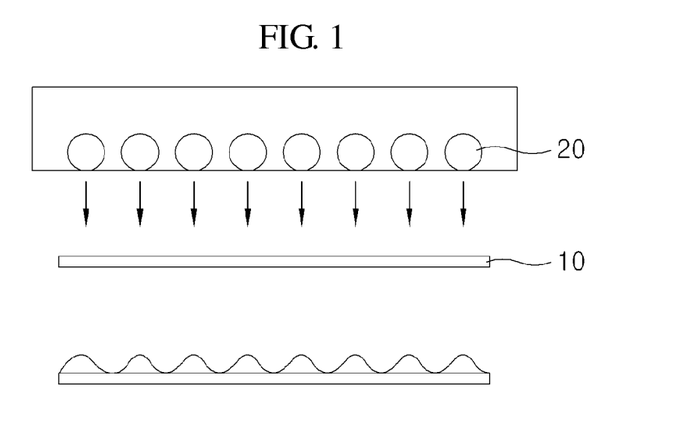
FIG. 1 is a cross-sectional view of a heat treatment process using an in-line type of tungsten halogen lamps.

FIG. 1 shows a cross-sectional view of a heat treatment process using in line-type tungsten halogen lamps. There is a problem of uniformity that a substrate is subjected to ununiform temperature depending on an arrangement pattern of lamps 20. For a heat treatment of semiconductors, such a problem may be slightly relieved by rotating a wafer. However, a large area substrate cannot be rotated.

Figure 2:
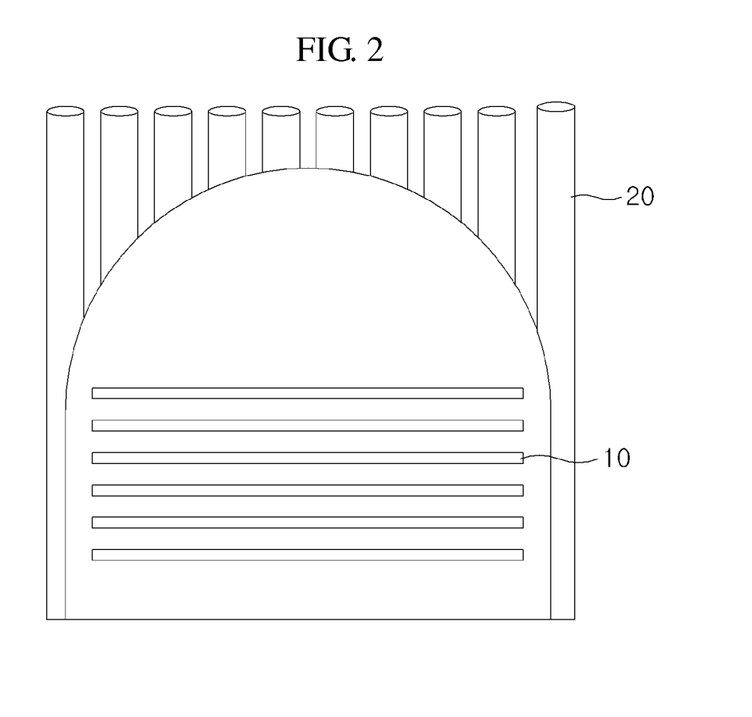
FIG. 2 is a cross-sectional view of a heat treatment process using a batch type of tungsten halogen lamps.

FIG. 2 shows a cross-sectional view of a heat treatment process using batch-type tungsten halogen lamps, which illustrates an indirect heating method through conduction from lamps 20. Likewise, for a batch-type heat treatment, there is a problem of uniformity that a substrate is subjected to ununiform temperature, because there is a temperature difference between an edge region adjacent to lamps 20 and a center region furthermost from lamps 20 within one substrate. Further, there is a problem that a temperature difference between substrates is generated depending on positions where substrates are situated (upper layer, medium layer, lower layer). Further, to solve such a problem of temperature uniformity, if a substrate is exposed to a heat source for a prolonged time, another problem that the substrate is subjected to thermal stress is caused.

PRIOR ART DOCUMENT

Patent Document 1: KR Patent Publication No. 2007-0109668

SUMMARY

Problems to be Solved

It is an object of the present invention to perform a heat treatment on a substrate using a lamp.

It is another object of the present invention to perform a uniform heat treatment on a surface of a substrate without rotating the substrate.

It is another object of the present invention to perform a stable heat treatment on a substrate.

It is still another object of the present invention to improve heat treatment ability while maintaining a uniform heat treatment.

Means to Solve the Problems

According to an embodiment of the present invention, an apparatus for substrate treatment comprises a processing chamber having a substrate treatment space; a heating housing having a heating lamp that emits radiant energy and a reflecting block that reflects radiant energy emitted from the heating lamp; and a window that maintains a sealing between the processing chamber and the heating housing and transmits the radiant energy to a substrate.

Also, the heating housing comprises a diffusion plate having a plurality of through-holes, which is provided below the reflecting block, and the radiant energy reflected by the reflecting block passes through the through-holes and is transferred to the window.

According to another embodiment of the present invention, an apparatus for substrate treatment comprises a processing chamber having a substrate treatment space; a heating housing having a heating lamp that emits radiant energy and a reflecting block that reflects radiant energy emitted from the heating lamp; and a window diffusion plate that maintains a sealing between the processing chamber and the heating housing and has a plurality of through-holes through which the radiant energy passes.

Also, the window diffusion plate comprises an upper plate having upper through-holes formed therein; a lower plate having lower through-holes formed at positions faced with the upper through-holes and spaced apart from the upper plate; a unit window placed between the upper plate and the lower plate, which is provided for each through-hole and transmits the radiant energy; and a cooling member provided between the upper plate and the lower plate at an area without the upper and lower through-holes.

Also, the unit window scatters radiant energy transferred from the heating housing and transmits the scattered radiant energy to the substrate. In addition, the unit window has unevenness on a surface thereof to scatter incident radiant energy.

According to an embodiment of the present invention, a heating apparatus comprises a heating lamp emitting radiant energy; a heating housing having a reflecting block that reflects radiant energy emitted from the heating lamp; and a window that maintains a sealing between a processing chamber and the heating housing and transmits the radiant energy to a substrate.

Effects of the invention

According to embodiments of the present invention, radiant energy from a lamp is not directly provided in a substrate, but is provided in the substrate via reflection or even scattering. Therefore, a uniform heat treatment can be performed on a small area substrate as well as a large area substrate. Also, according to embodiments of the present invention, a lamp heat source is used for a large area substrate instead of a laser heat source, thereby reducing production costs. In addition, heat treatment uniformity can be improved without a separate rotating unit to rotate a substrate, thereby reducing production costs. Further, according to embodiments of the present invention, since a window itself scatters radiant energy, a separate diffusion plate is not necessary. Therefore, a slim apparatus for substrate treatment can be manufactured, thereby improving heat treatment ability.

DETAILED DESCRIPTION OF THE INVENTION

Now, embodiments according to the present invention will be described in detail with reference to the accompanying drawings. However, the present invention is not limited to these embodiments, but may be practiced as various different configurations. These embodiments are provided for a full understanding of the present invention, and the scope of the present invention may be fully understood by one with ordinary skill in the art with reference to these embodiments. In the drawings, like numbers represent like elements.

Hereinafter, an apparatus for substrate treatment will be described by way of example in a process for heat treatment. However, it will be applicable in various processes other than a process for heat treatment. Further, an apparatus for substrate treatment described below will be applicable for heat treatment of a large area substrate, in particular a glass substrate of a flat plate display panel as well as in various substrate treatment processes.

Figure 3:
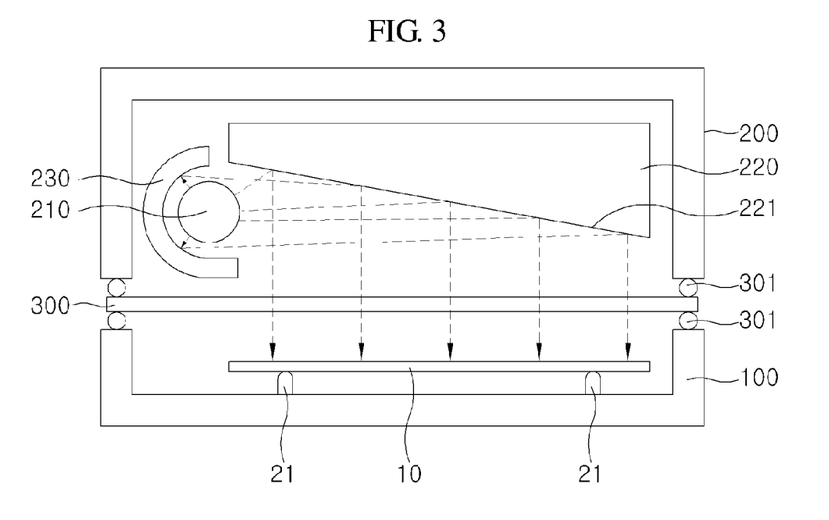
FIG. 3 is a cross-sectional view of an apparatus for substrate treatment having a reflecting block according to an embodiment of the present invention.

FIG. 3 is a cross-sectional view of an apparatus for substrate treatment having a reflecting block according to an embodiment of the present invention. In general, a temperature required for a process for heat treatment of a large area oxide TFT (Oxide TFT) is less than 400° C. Therefore, a high temperature heat treatment by direct radiation of radiant energy is not required. Hence, in an embodiment of the present invention, radiant energy is provided on a substrate without direct irradiation from a heating lamp. To improve the uniformity of irradiated radiant energy, radiant energy is provided on a substrate while reflecting and scattering radiant energy, instead of rotating the substrate, as will be described below.

A processing chamber 100 has an inner space in which a substrate is situated and subjected to heat treatment. The processing chamber is formed as a hollow quadrangled container, but not limited to and may be formed as various shapes. That is, it may be formed as cylindrical and polygonal-shaped containers. An entry port (not shown) for entering and exiting a substrate 10 is each provided on one side and the other side of the processing chamber, and either entry port is connected to a transferring module (not shown).

The processing chamber 100 has a substrate support (not shown) therein to support the substrate 10. The substrate support may have a plurality of lift pins 21 therein which move vertically, and comprises an edge ring on which a substrate is situated during heat treatment processing.

The edge ring is a receiving means to situate a substrate at a position faced with a heating housing within a heat treatment space. The substrate support may be connected to an ascending and descending means, for example a cylinder. In this embodiment, the lift pins 21 supports a substrate as previously described, but not limited to this. Various means to support a substrate on a substrate support, for example means using electrostatic power (electrostatic chuck) or vacuum aspiration may be used.

A heating housing 200 has a heating lamp 210 that emits radiant energy and a reflecting block 220 that reflects radiant energy emitted from the heating lamp. The heating housing 200 also comprises an insulating reflection plate 230 that prevents radiant heat of radiant energy from the heating lamp from being transferred to the heating housing and reflects it toward an interior of the heating housing.

The heating lamp 210 is a heat source device that emits radiant energy of radiant heat in the form of light. Radiant energy is transferred in the form of emitted light, and the radiant energy has the same properties as the straight-ability and the reflectivity of light. The heating lamp may be formed as a bulb type or a linear type. The heating lamp 210 comprises a heating lamp body that transmits radiant energy, a filament provided within the lamp body and a lamp socket from which an external power is applied. The body of the heating lamp 20 may preferably be made as a hollow tubular form (i.e. tube shape), for example a linear tube shape, but not limited to this. The body may be made as a curved, circular strip or oval strip shape. To transmit radiant energy without any loss, the heating lamp body is preferably made from glass or quartz. Also, an interior of the heating lamp body may effectively be filled with inert gases (e.g. argon). Alternatively, as the heating lamp, an arc lamp (flash lamp) may be used, instead of a tubular body having a filament as previously described.

Figure 7:
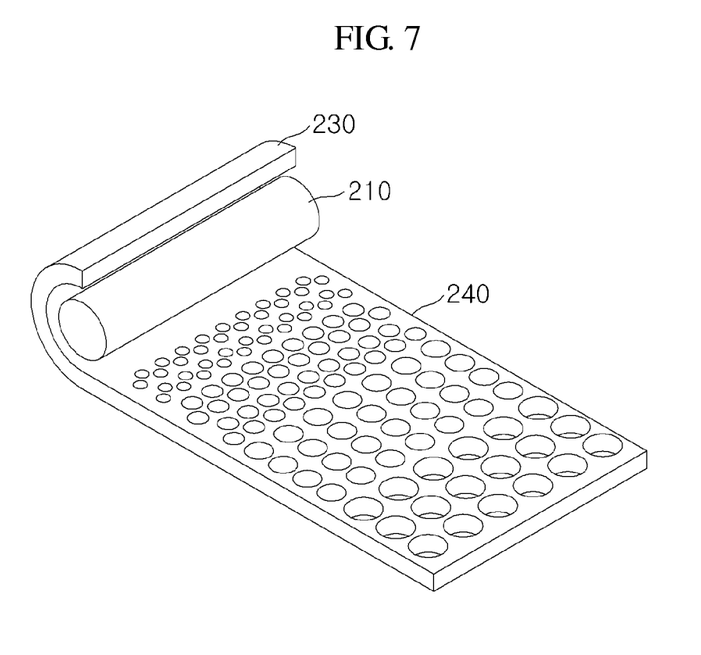
FIG. 7 is a perspective view of an insulating reflection plate wrapping a heating lamp according to an embodiment of the present invention.

A surface of the insulating reflection plate 230 is made from a material that prevents radiant energy from the heating lamp from being transferred to the heating housing and reflects it toward an inner side of the heating housing. The insulating reflection plate 230 is placed between an inner wall of the heating housing 200 and the heating lamp, and blocks and reflects radiant energy from the heating lamp transferred to the inner wall of the heating housing. Therefore, the radiant energy is not transferred in undesirable directions other than a substrate. As a result, the effectiveness of heat source may be enhanced. The insulating reflection plate 230 may be placed in adjacent to the heating lamp or in spaced apart from the heating lamp between the inner wall of the heating housing and the heating lamp. Also, the insulating reflection plate 230 may have various forms depending on a shape of the heating lamp. For example, as shown in FIG. 7, where the heating lamp 210 has a tubular body, the insulating reflection plate 230 may have a curved form wrapping the tubular body to prevent radiant energy from the heating lamp from being transferred to the inner wall of the heating housing. Thus, the insulating reflection plate in the form of wrapping the heating lamp prevents radiant energy from being directed in an inner wall direction and reflects it toward a reflecting block direction. In addition, the insulating reflection plate may be formed as any shape such as a curved shape, a linear shape or a combination thereof, as long as it wraps the lamp body and blocks and reflects radiant energy from the heating lamp transferred to the inner wall of the heating housing.

The reflecting block 220 is a block element that reflects radiant energy emitted from the heating lamp. The reflecting block 220 has an inclined surface 221 having a slope at a side faced with a substrate and transfers radiant energy emitted from the heating lamp 230 to the substrate. As the reflecting block keeps apart from the heating lamp, a distance between the inclined surface of the reflecting block and a substrate to be heat-treated should be narrow. To this end, a slope is imparted to the inclined surface 221 of the reflecting block 220. Then, the heating lamp is placed on the same horizontal line such that radiant energy is transferred to the inclined surface 221 of the reflecting block. Thus, radiant energy emitted from the heating lamp is reflected by the inclined surface 221 of the reflecting block. As a result, radiant energy from the heating lamp may be uniformly transferred to a region of the substrate 10 adjacent to the heating lamp and a region of the substrate 10 apart from the heating lamp.

As described above, by irradiating uniformly radiant energy reflected by a reflecting block not irradiating radiant energy from a heating lamp directly on a substrate, temperature uniformity may be improved. For a large area Oxide TFT substrate, it is sufficient that a temperature required for a heat treatment process is less than 400° C. Therefore, a high temperature heat treatment by direct heat source radiation is not required. For a low temperature heat treatment, the surface temperature uniformity of a substrate may be enhanced by providing radiant energy reflected not providing radiant energy directly toward the substrate. Additionally, if the reflected heat source is scattered and provided on the substrate, the temperature uniformity may be further enhanced, as will be described below.

The inclined surface of the reflecting block 220 and a surface of the insulating reflection plate 230 may be coated with gold to increase reflectivity and to reflect effectively radiant energy emitted from the heating lamp. Alternatively, the inclined surface of the reflecting block and each surface of the insulating reflection plate may be polished to increase reflectivity.

Figure 8:
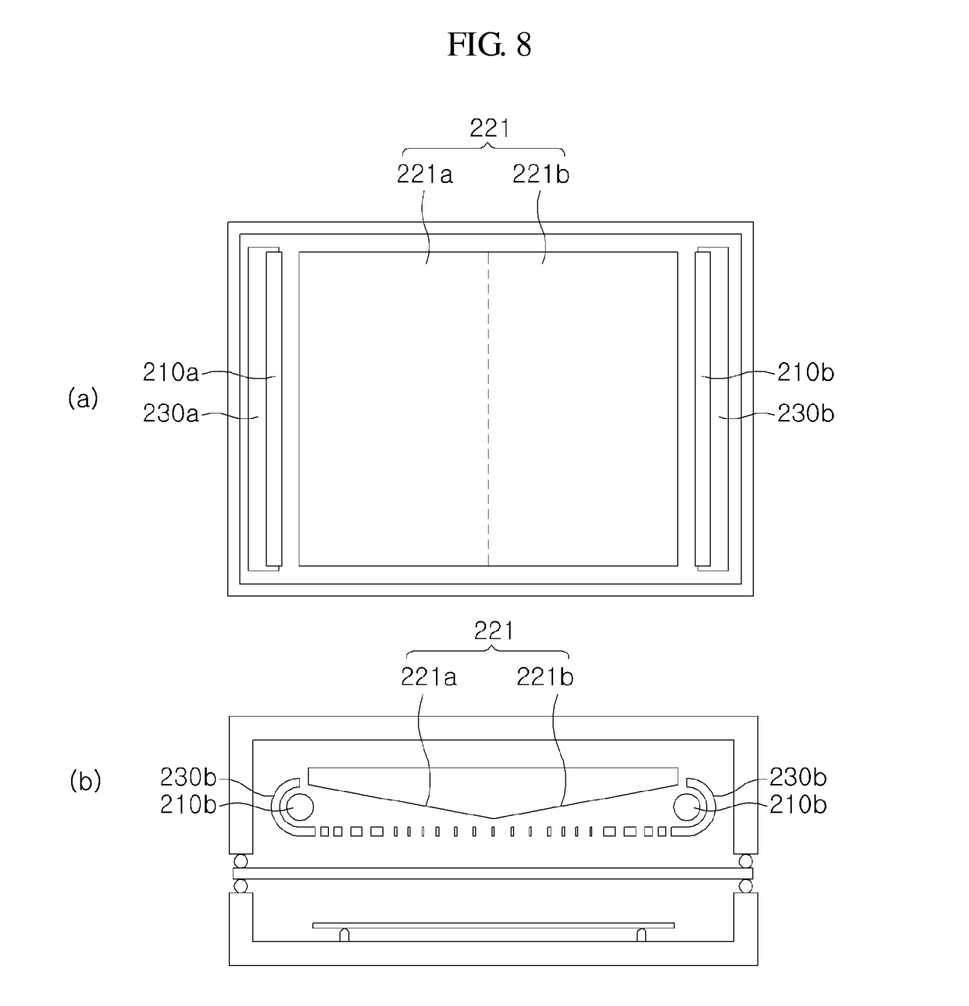
FIGS. 8(a) and 8(b) each is a top view and a front view of a heating housing having two heating lamps therein according to an embodiment of the present invention.
Figure 9:
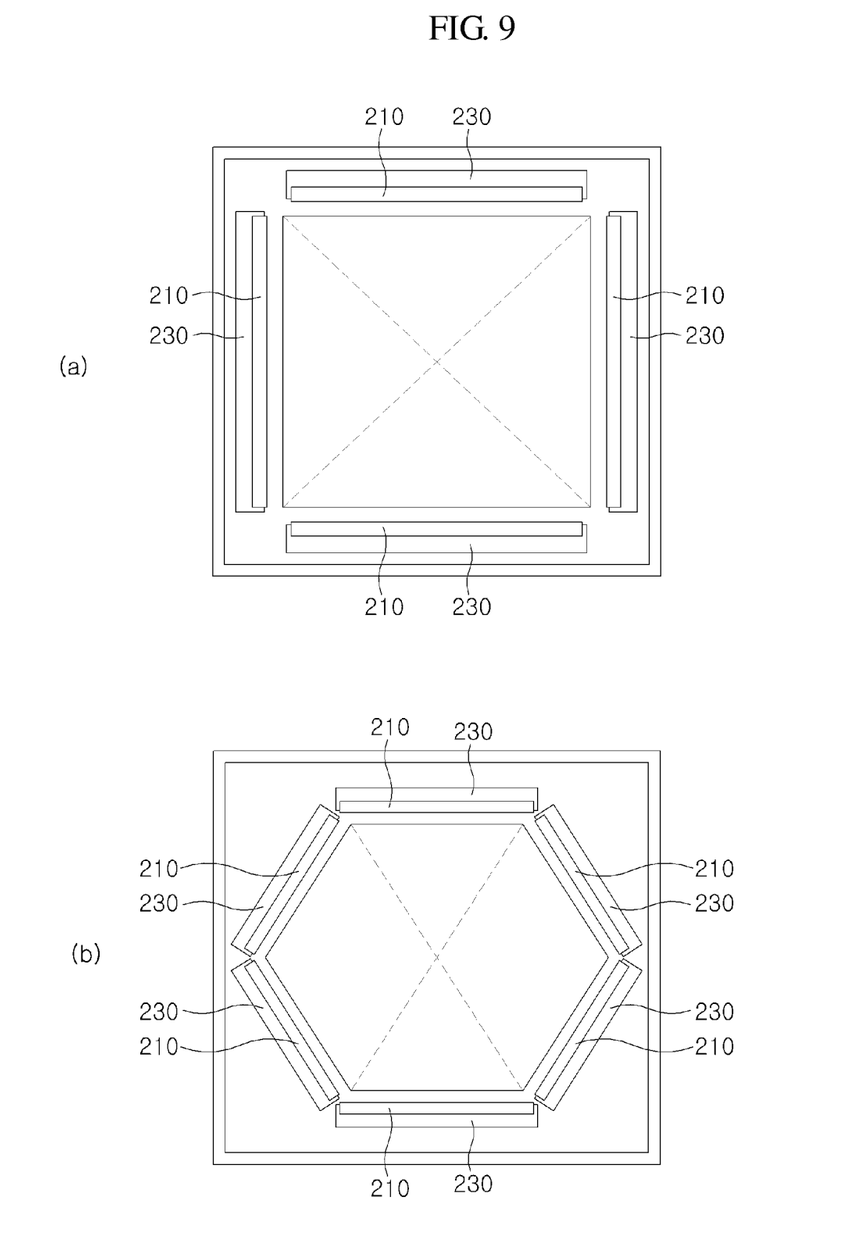
FIGS. 9(a) and 9(b) each shows a heating housing having four or six heating lamps disposed therein, respectively, according to embodiments of the present invention.

The heating lamp 210 may be provided as a plurality of heating lamps within the heating housing. FIG. 8 is a top view (a) and a front view (b) showing a heating housing having two heating lamps therein according to an embodiment of the present invention. That is, where a quadrangled heating housing has two heating lamps, these two heating lamps may be provided at positions faced with each other, as shown in FIG. 8(a). Alternatively, as shown in FIG. 9, four or six heating lamps may be disposed within the heating housing, as in FIG. 9(a) and FIG. 9(b). When a plurality of heating lamps is provided, each heating lamp is disposed such that radiant energy enters toward an inclined surface of a reflecting block within the heating housing. In this case, the reflecting block is divided into a plurality of areas assigned for each heating lamp, and these areas have different inclined surface. That is, each area has an inclined form such that as it keeps apart from each heating lamp, a distance between an inclined surface of each area and a substrate to be heat-treated becomes narrow. As shown in FIG. 8(b), when the heating lamps are provided at positions faced with each other around the reflecting block, the reflecting block is divided into two areas. A first area is assigned to a first heating lamp 210a and has a first inclined surface 221a that directs radiant energy emitted from the first heating lamp 210a toward a substrate. A second area is assigned to a second heating lamp 210b and has a second inclined surface 221b that directs radiant energy emitted from the second heating lamp 210b toward a substrate. As described above, by altering a lamp arrangement and a reflecting block shape, a high temperature region may also be treated. Also, when a plurality of heating lamps is used, each of heating lamps has an insulating reflection plate which prevents radiant energy emitted from each heating lamp from being transferred to an inner wall of the heating housing.

A window 300 as shown in FIG. 3 transmits radiant energy reflected by the heating housing 200 to the substrate 10. The window 300 maintains a sealing between the heating housing and the processing chamber 100. The window 300 maintains vacuum within the processing chamber by sealing a gap between the heating housing 200 and the processing chamber 100 and protects the processing chamber from external environments (pressure, gases, contaminants). Also, the window 300 protects the heating lamp and prevents impurities generated due to heat from the heating lamp from dropping on the substrate situated in a heat treatment space within the chamber. In an embodiment of the present invention, quartz having energy penetrating and radiating property may be effectively used as the window 300, but not limited to this. It will be appreciated that various materials having energy penetrating and radiating property may be used, instead of quartz window. The window 300 seals completely a gap between the heating housing 200 and the processing chamber 100 using a sealing means such as O-ring 301 between the heating housing and the processing chamber such that vacuum is maintained.

A pyrometer (not shown) is a means to measure a temperature of the substrate 10, and a plurality of pyrometers is provided on a bottom of the substrate 10. A measured temperature of the substrate is used by feedback to control an amount of radiant energy emitted from the heating lamp. A pyrometer calculates energy by measuring an intensity of wavelength generated by heat from the substrate. For reference, a wavelength measured in a pyrometer is converted to energy, and the energy is calculated. As can be appreciated, the conversion of wavelength to energy may be achieved using the following equation: $E=(hc)/\lambda$, where E is energy, $\lambda$ is a wavelength, h is a Planck constant, c is radiant energy flux. Thus, a wavelength generated from a substrate heat-treated within the processing chamber is measured and the wavelength is converted to energy of the substrate. Then, the energy may be calculated. Using a calculated energy, absolute temperature T may be calculated using the following equation: $E=3/2\times nRT$, where E is energy, n is mol number, R=a gas constant, T=absolute temperature. As a result, a substrate temperature may be measured using a pyrometer.

In this apparatus for substrate treatment, the heating housing transfers uniformly radiant energy reflected by the reflecting block 220 to a surface of a substrate. The heating housing has a separate diffusion plate to diffuse radiant energy reflected by the reflecting block and to transfer it to the substrate.

Figure 4:
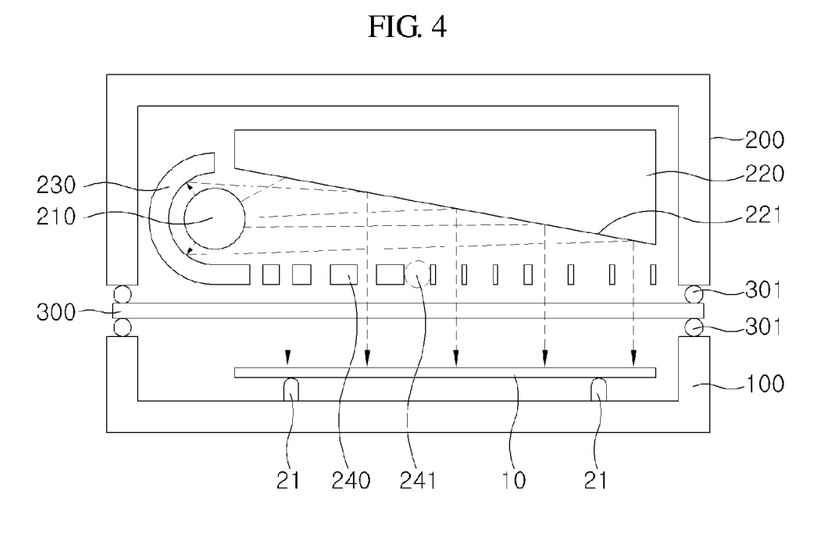
FIG. 4 is a cross-sectional view of an apparatus for substrate treatment having a diffusion plate according to an embodiment of the present invention.

FIG. 4 is a cross-sectional view of an apparatus for substrate treatment having a diffusion plate 240 according to an embodiment of the present invention.

The diffusion plate 240 has a plurality of through-holes and is provided between the inclined surface 221 of the reflecting block 220 and the window 300. Radiant energy reflected by the reflecting block 220 passes through the through-holes 241 and transfers to the window 300. Thus, radiant energy reflected by the reflecting block passes through a plurality of through-holes 241, and the passed radiant energy penetrates the window and is transferred uniformly to a substrate. The diffusion plate may be made from a material having light reflecting property and integrated with an insulating reflection plate. Also, a surface of the insulating reflection plate may be coated by plating or polished to improve reflectivity.

Figure 10:
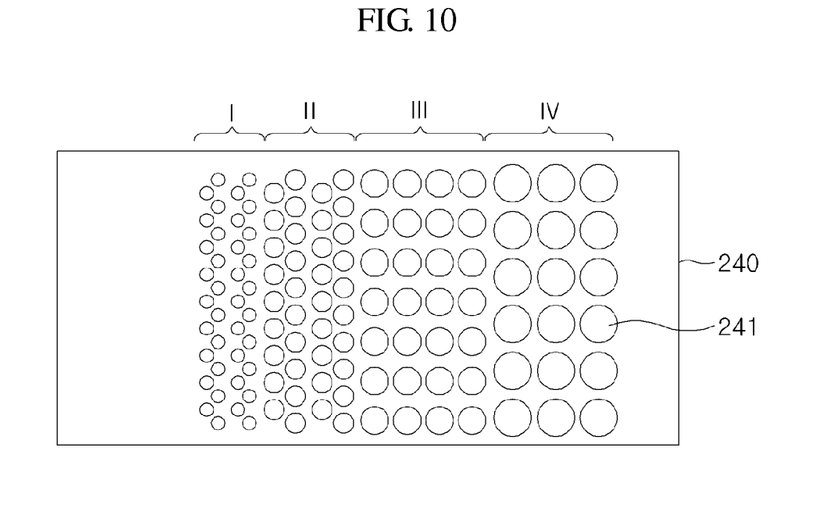
FIG. 10 shows through-holes grouped and disposed on a surface of a diffusion plate according to an embodiment of the present invention.

A plurality of through-holes 241 formed on the diffusion plate 240 has different sizes. Radiant energy passing through through-holes having different sizes is also diffused as energies having different sizes. These through-holes 241 have larger sizes as they keeps apart from the heating lamp 210. By disposing larger through-holes 241 at regions apart from the heating lamp 210, reflected radiant energy may be transferred to a surface of a substrate at a constant amount. Radiant energy from the heating lamp is densely transferred and reflected to an inclined surface of the reflecting block adjacent to the heating lamp 210, while a small amount of radiant energy is transferred to an inclined surface of the reflecting block apart from the heating lamp. Therefore, by disposing larger through-holes 241 as they keeps apart from the heating lamp 210, uniform temperature radiations may be achieved on a substrate. Also, these through-holes may be grouped according to their sizes such that through-holes having the same size belong to one group. For example, a size of each through-hole in a group of through-holes may have the following order: a first group of through-holes (I)<a second group of through-holes (II)<a third group of through-holes (III)<a fourth group of through-holes (IV). When these groups of through-holes are disposed on a surface of the diffusion plate as shown in FIG. 10, the first group of through-holes (I) having the smallest size is disposed at a region adjacent to the heating lamp, and the fourth group of through-holes (IV) having the largest size is disposed at a region furthermost from the heating lamp.

As described above, since FIG. 3 and FIG. 4 have the window 300 between the heating housing 300 and the processing chamber 100, radiant energy transferred from the heating housing passes through the window and is transferred to a substrate in the processing chamber. To the contrary, as shown in FIG. 5, a window diffusion plate 310 may function as a window without a separate window.

Figure 5:
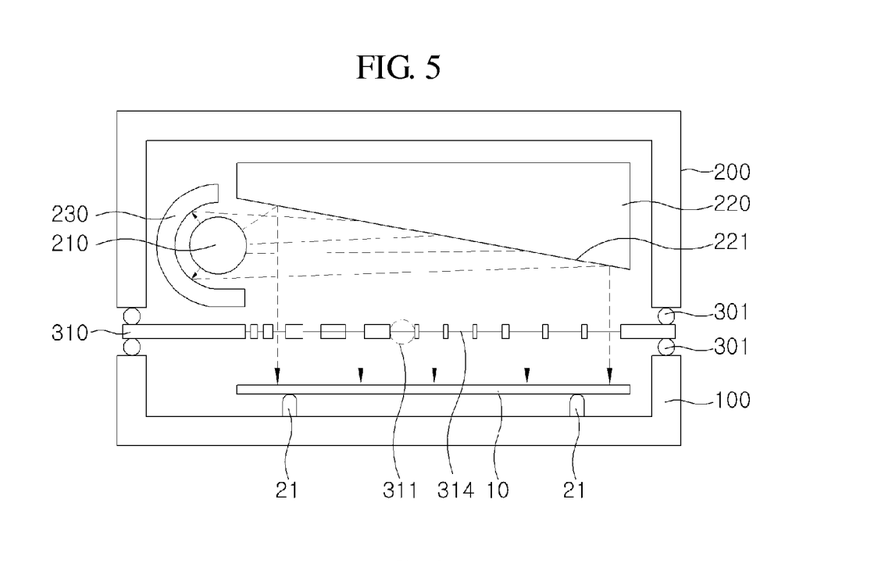
FIG. 5 is a cross-sectional view of an apparatus for substrate treatment having a window diffusion plate according to an embodiment of the present invention.

FIG. 5 is a cross-sectional view of an apparatus for substrate treatment having a window diffusion plate 310 according to an embodiment of the present invention.

An apparatus for substrate treatment shown in FIG. 5 has a window diffusion plate 310 through which radiant energy passes, not having a transparent window made of quartz. The window diffusion plate is made from an opaque material and has a plurality of through holes 311 in the plate. Radiant energy reflected by a reflecting block passes through these through-holes 311 and is transferred to a substrate. Radiant energy reflected by a reflecting block passing through these through-holes having different sizes is transferred to a substrate with diffusion. Therefore, uniform radiant energy radiations may be achieved on a surface of the substrate. The window diffusion plate is formed between a heating housing and a processing chamber to maintain a sealing between the heating housing and the processing chamber, as is the window of FIG. 3 and FIG. 4. A sealing means such as O-ring 301 is used to maintain said sealing. Also, these through-holes 311 formed on the window diffusion plate 310 have different sizes, and may have larger sizes as they keeps apart from a heating lamp, as is through-holes formed on the window diffusion plate.

In addition, through-holes formed on the window diffusion plate 311 may have a unit window for each through-hole through which radiant energy passes to maintain air tightness of the processing chamber.

Figure 11:
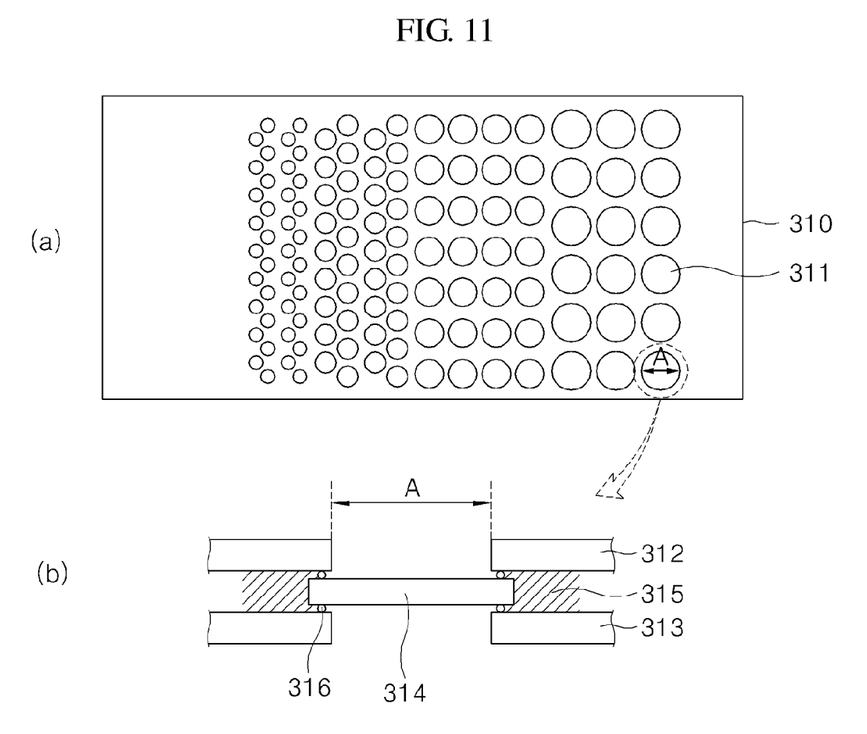
FIG. 11 shows a top view and a cross-sectional view of a window diffusion plate according to an embodiment of the present invention.

FIG. 11 is a diagram showing a window diffusion plate according to an embodiment of the present invention, wherein FIG. 11(a) is a top front view of the window diffusion plate, and FIG. 11(b) is a cross-sectional view of the window diffusion plate.

The window diffusion plate 310 comprises an upper plate 312 having upper through-holes and a lower plate 313 having lower through-holes formed at positions faced with the upper through-holes and spaced apart from the upper plate; a unit window 314 placed between the upper plate and the lower plate, which is provided for each through-hole 311 and transmits radiant energy; and a cooling member 315 provided between the upper plate and the lower plate at an area without the upper and lower through-holes.

The window diffusion plate 310 has a dual structure comprising an upper plate and a lower plate spaced apart from each other. The upper plate has a plurality of upper through-holes, and the lower plate also has lower through-holes at the same positions as positions where the upper through-holes are formed. Therefore, when viewing the window diffusion plate from above, one through-hole passing through the upper and lower through-holes is formed.

In the window diffusion plate, a unit window and a cooling member are provided between the upper plate 312 and the lower plate 313. The cooling member is provided at an area without through-holes 311 between the upper plate and the lower plate and prevents heat of the window diffusion plate itself from being transferred to a substrate. To control a heating lamp, only radiant energy emitted from the heating lamp should be transferred to a substrate, and a temperature of the substrate is measured and used. For a feedback control of a heating lamp as described above, an accurate temperature of substrate should be measured. However, if heat is generated from the window diffusion plate 310, there is a problem that separate heat energy is transferred to a substrate in addition to heat energy provided directly by radiant energy from the heating lamp. Therefore, radiant energy irradiated on a surface of an area without through-holes in the window diffusion plate should not be transferred to the lower plate, but only radiant energy passing through the unit window should be transferred to the substrate. To this end, the cooling member 315 is placed between the upper plate and the lower plate of the window diffusion plate. As the cooling member 315, a cooling means such as PCW (Process Cooling Water) as chilled water thermostatic means may be used.

The unit window formed for each through-hole of the window diffusion plate is made from a transparent material such as quartz, thereby transmitting radiant energy reflected by a reflecting block in each of through-holes. The unit window also serves as a conventional window. That is, the unit window prevents impurities generated from a heating housing from dropping on a substrate within a processing chamber through through-holes, and maintains a sealing of the processing chamber such that vacuum is maintained. To this end, the unit window and the upper plate (or the lower plate) have a sealing means such as O-ring 316.

The unit window 314 transmits radiant energy transferred from the heating housing and also may scatter the radiant energy. To this end, unevenness is formed on an upper surface, a lower surface, or both surfaces of the unit window (at least one of upper and lower surfaces), so that radiant energy reflected by the reflecting block may be scattered and transferred to a lower substrate.

Figure 12:
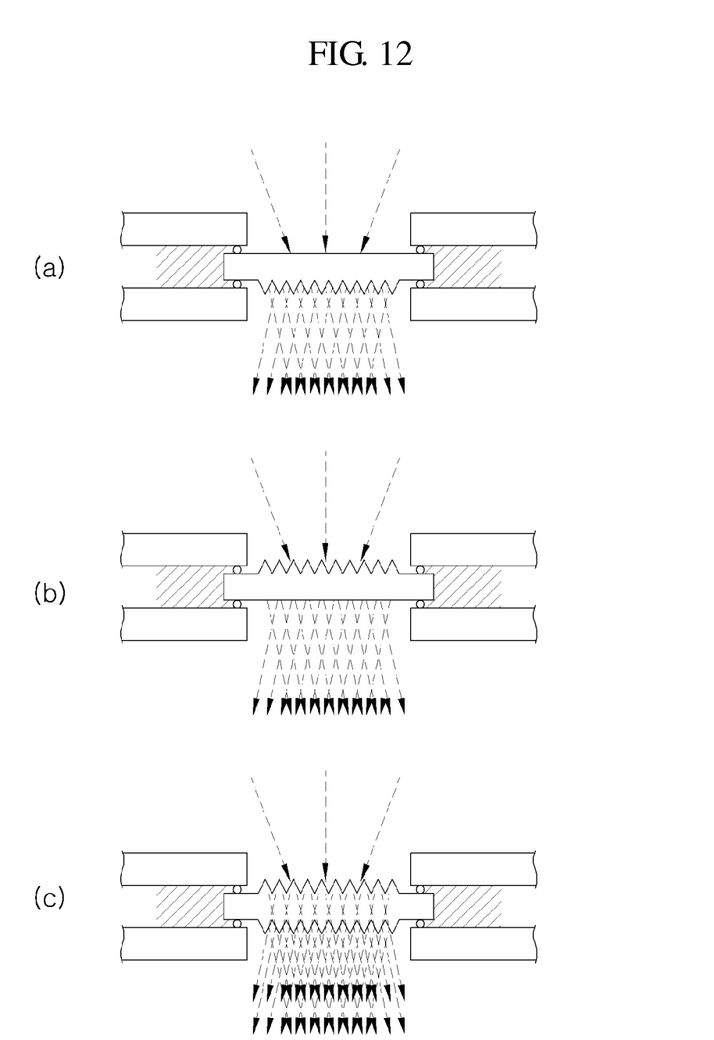
FIGS. 12(a), 12(b) and 12(c) each is a cross-sectional view of unevenness formed on a surface of a window diffusion plate according to embodiments of the present invention.

For example, as shown in FIG. 12(a), unevenness may be formed on a lower surface of the unit window, so that radiant energy passing through an upper surface is scattered from the unevenness on the lower surface and transferred to a substrate. Also, as shown in FIG. 12(b), unevenness may be formed on an upper surface of the unit window, so that radiant energy reaching the upper surface is scattered, and subsequently the scattered radiant energy passes through the lower surface and is transferred to a substrate. Also, as shown in FIG. 12(c), unevenness may be formed on both of upper and lower surfaces of the unit window, so that radiant energy reaching the upper surface is scattered, and the scattered radiant energy is again scattered in the lower surface and transferred to a substrate.

If unevenness is formed on both of upper and lower surfaces of the unit window, a refraction angle of unevenness formed on the upper surface should be different from a refraction angle of unevenness formed on the lower surface. As a result, a scattering angle of the upper surface is different from a scattering angle of the lower surface since a scattering angle is altered according to a refraction angle of unevenness, thereby further enhancing a scattering effect.

Figure 6:
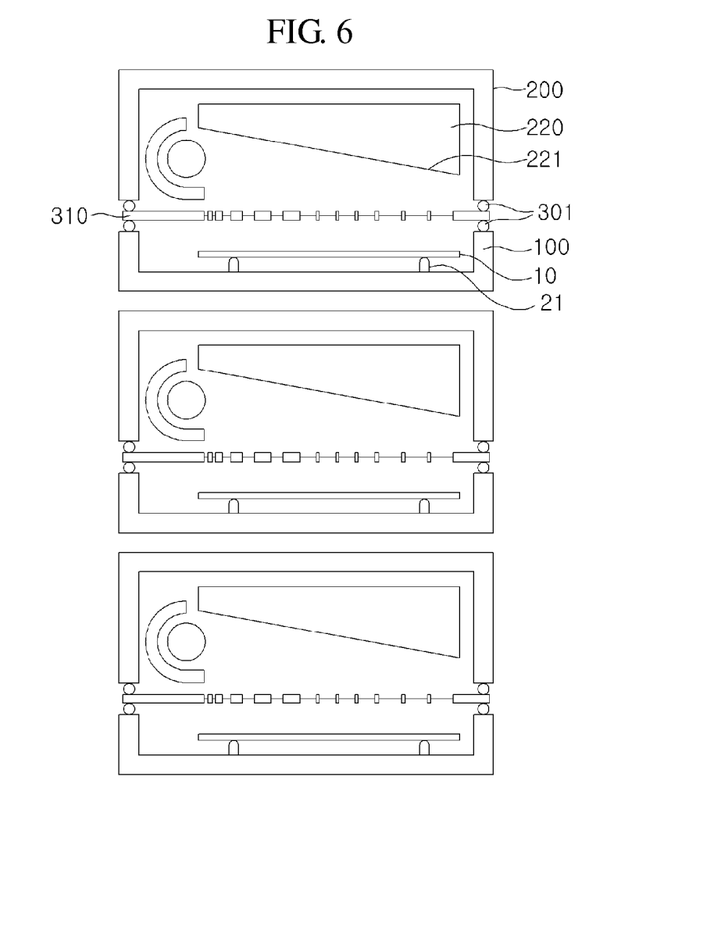
FIG. 6 is a cross-sectional view of a structure in which a number of apparatuses for substrate treatment are vertically stacked in multi-layers according to an embodiment of the present invention.

As shown in FIG. 5, if both of scattering and sealing functions are achieved using the window diffusion plate without a separate window, a compact and slim apparatus for substrate treatment may be manufactured. Therefore, as shown in FIG. 6, a number of apparatuses for substrate treatment may be vertically stacked in multi-layers, and the number of substrates to be treated at the same time may be increased, resulting in an enhancement in productivity.

Figure 13:
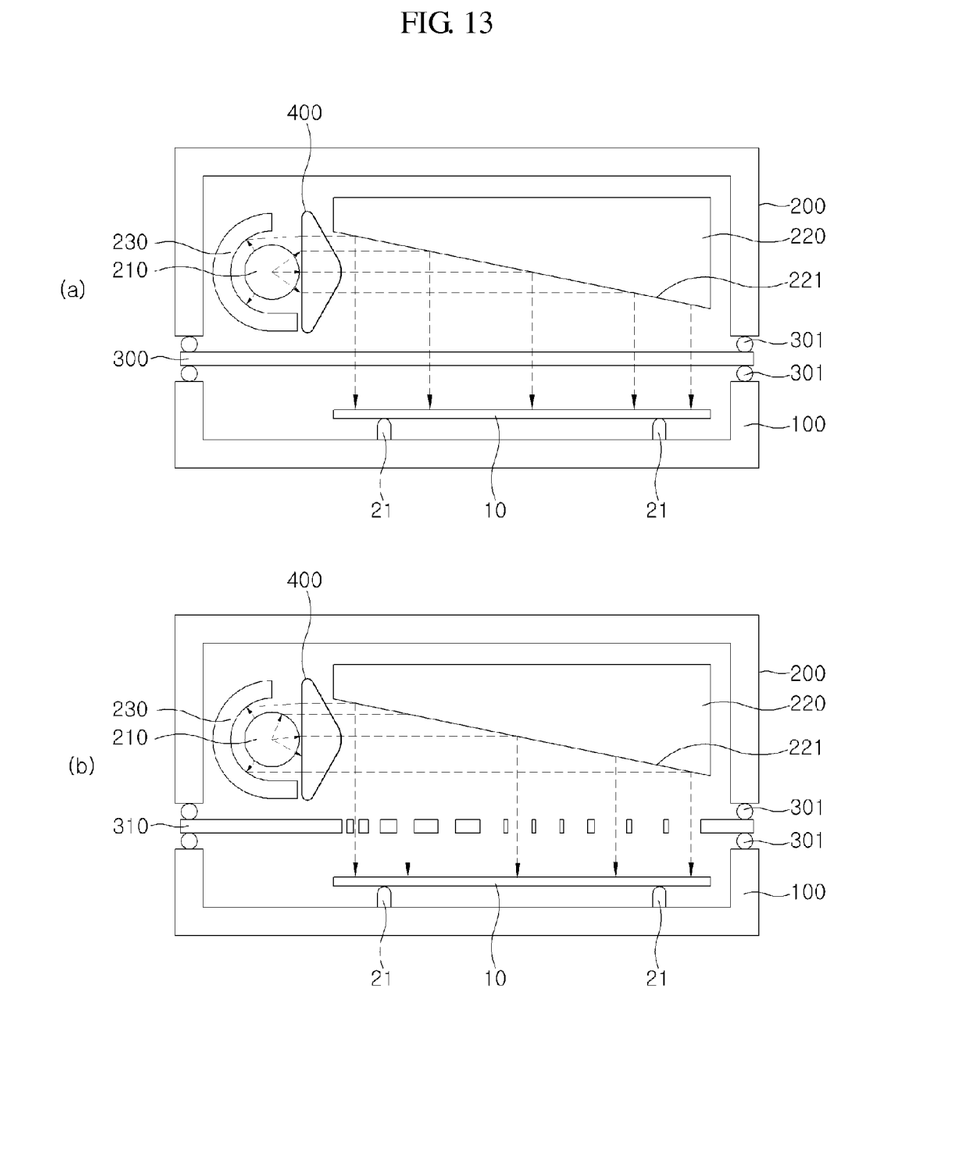
FIG. 13 is a cross-sectional view of an apparatus for substrate treatment having a lens which transmits in parallel to an inclined surface of a reflecting block radiant energy emitted from a heating lamp according to an embodiment of the present invention.

As shown in FIG. 3 through FIG. 6, radiant energy emitted from the heating lamp is transferred to the reflecting surface of the reflecting block in the form of radiation. To enter uniformly the reflecting block, as shown in FIG. 13, a lens is provided to transmit radiant energy emitted from the heating lamp in parallel to the inclined surface of the reflecting block. As this lens, a lens emitting in parallel incident radiant energy such as a parallel rays covert lens may be used.

For reference, FIG. 13(a) is a diagram showing an apparatus for substrate treatment having a window 300 with a lens 400 between a heating lamp 210 and a reflecting block 220, radiant energy emitted from the heating lamp entering in parallel an inclined surface of the reflecting block. FIG. 13(b) is a diagram showing an apparatus for substrate treatment having a window diffusion plate 310 with a lens 400 between a heating lamp 210 and a reflecting block 220, radiant energy emitted from the heating lamp entering in parallel an inclined surface of the reflecting block.

The present invention has been described in detail with reference to the foregoing embodiments and the accompanying drawings. However, the present invention should not be limited to these embodiments, and the present invention is limited to only the following claims. It is to be understood by one with ordinary skill in the art that various modifications may be made to the present invention without departing from the technical spirit and the scopes of the claims.

DESCRIPTION OF REFERENCE NUMBERS

100: processing chamber 200: heating housing
210: heating lamp 220: reflecting block
230: insulating reflection plate 240: diffusion plate
300: window 310: window diffusion plate
400: lens

The invention claimed is:

1. An apparatus for substrate treatment comprising
a processing chamber having a substrate treatment space for a substrate to be situated and subject to heat treatment;
a heating housing having a heating lamp that emits radiant energy and a reflecting block that reflects radiant energy emitted from the heating lamp, wherein the reflecting block has an inclined surface at a side facing the substrate and a distance between the inclined surface of the heating reflecting block and the substrate decreases in a direction that the heating reflecting block is apart from the heating lamp, and wherein the heating lamp is disposed such that the radiant energy is transferred to the inclined surface of the reflecting block and reflected to the substrate; and
a window that maintains a sealing between the processing chamber and the heating housing and transmits the radiant energy to the substrate.

2. The apparatus for substrate treatment of claim 1 wherein the heating housing comprises a diffusion plate having a plurality of through-holes, which is provided below the reflecting block, and wherein the radiant energy reflected by the reflecting block passes through the through-holes and is transferred to the window.

3. An apparatus for substrate treatment comprising
a processing chamber having a substrate treatment space;
a heating housing having a heating lamp that emits radiant energy and a reflecting block that reflects radiant energy emitted from the heating lamp; and
a window diffusion plate that maintains a sealing between the processing chamber and the heating housing, wherein the window diffusion plate has a plurality of through-holes and each of the plurality of through-holes has a unit window through which the radiant energy passes and wherein each unit window is sealed to the window diffusion plate by a sealing means.

4. The apparatus for substrate treatment of claim 3 wherein the through-holes have difference sizes, and the through-holes have larger sizes as they keeps apart from the heating lamp.

5. The apparatus for substrate treatment of claim 3 wherein the through-holes have difference sizes, and the through-holes having the same size are grouped and formed on the diffusion plate as distinct groups.

6. The apparatus for substrate treatment of claim 1 wherein the heating housing comprises an insulating reflection plate placed between an inner sidewall of the heating housing and the heating lamp, which blocks radiant energy from the heating lamp transferred to the inner sidewall of the heating housing and reflects the radiant energy.

7. The apparatus for substrate treatment of claim 3 wherein the heating housing comprises an insulating reflection plate placed between an inner sidewall of the heating housing and the heating lamp, which blocks radiant energy from the heating lamp transferred to the inner sidewall of the heating housing and reflects the radiant energy.

8. The apparatus for substrate treatment of claim 7 wherein surfaces of the reflecting block and the insulating reflection plate are coated with gold or polished to increase reflectivity.

9. The apparatus for substrate treatment of claim 7 wherein the heating lamp is formed as a tubular body having a filament therein or an arc lamp, and the insulating reflection plate is formed as any one of a linear shape, a curved shape and a combination thereof to block radiant energy from the heating lamp transferred to the inner sidewall of the heating housing.

10. The apparatus for substrate treatment of claim 3, wherein the unit window is made from a transparent material.

11. The apparatus for substrate treatment of claim 3 wherein the reflecting block has an inclined surface at a side faced with the substrate and the heating lamp is disposed such that radiant energy is transferred to the inclined surface of the reflecting block.

12. The apparatus for substrate treatment of claim 11 wherein the inclined surface of the reflecting block has an inclined shape such that a distance between the inclined surface of the reflecting block and a substrate to be heat-treated becomes narrow as the reflecting block keeps apart from the heating lamp.

13. The apparatus for substrate treatment of claim 1 wherein the heating lamp is divided as a plurality of lamps, and the reflecting block is divided into a plurality of areas assigned for each heating lamp, and wherein an inclined surface of each area has an inclined shape such that a distance between the inclined surface of each area and a substrate to be heat-treated becomes narrow as it keeps apart from each heating lamp.

14. The apparatus for substrate treatment of claim 3 wherein the heating lamp is divided as a plurality of lamps, and the reflecting block is divided into a plurality of areas assigned for each heating lamp, and wherein an inclined surface of each area has an inclined shape such that a distance between the inclined surface of each area and a substrate to be heat-treated becomes narrow as it keeps apart from each heating lamp.

15. The apparatus for substrate treatment of claim 3 wherein the window diffusion plate comprises
an upper plate having upper through-holes formed therein;
a lower plate having lower through-holes formed at positions faced with the upper through-holes and spaced apart from the upper plate;
the unit window placed between the upper plate and the lower plate; and
a cooling member provided between the upper plate and the lower plate at an area without the upper and lower through-holes.

16. The apparatus for substrate treatment of claim 15 wherein the unit window scatters radiant energy transferred from the heating housing and transmits the scattered radiant energy to the substrate.

17. The apparatus for substrate treatment of claim 15 wherein the unit window has unevenness on a surface thereof to scatter incident radiant energy.

18. The apparatus for substrate treatment of claim 17 wherein the unevenness is formed on at least one of upper surface and lower surface of the unit window.

19. The apparatus for substrate treatment of claim 18 wherein when the unevenness is formed on both of upper and lower surfaces of the unit window, a refraction angle of unevenness formed on the upper surface is different from a refraction angle of unevenness formed on the lower surface.

20. The apparatus for substrate treatment of claim 1 wherein a lens is provided between the heating lamp and the reflecting block, which transmits radiant energy emitted from the heating lamp in parallel to the inclined surface of the reflecting block.

21. A heating apparatus comprising
a heating lamp emitting radiant energy;
a heating housing having a reflecting block that reflects radiant energy emitted from the heating lamp, wherein the reflecting block has an inclined surface at a side facing a substrate that is disposed in a processing chamber and a distance between the inclined surface of the heating reflecting block and the substrate decreases in a direction that the heating reflecting block is apart from the heating lamp, and wherein the heating lamp is disposed such that the radiant energy is transferred to the inclined surface of the reflecting block and reflected to the substrate; and
a window that maintains a sealing between the heating housing and the processing chamber and transmits the radiant energy to the substrate.

22. The heating apparatus of claim 21 comprising a diffusion plate having a plurality of through-holes, which is provided below the reflecting block, and wherein the radiant energy reflected by the reflecting block passes through the through-holes and is transferred to the window.

23. A heating apparatus comprising
a processing chamber having a substrate treatment space;
a heating housing having a heating lamp that emits radiant energy and a reflecting block that reflects radiant energy emitted from the heating lamp; and
a window diffusion plate that maintains a sealing between the processing chamber and the heating housing, wherein the window diffusion plate has a plurality of through-holes and each of the plurality of through-holes has a unit window through which the radiant energy passes and wherein each unit window is sealed to the window diffusion plate by a sealing means.

24. The heating apparatus of any one of claim 21 wherein the heating housing comprises an insulating reflection plate placed between an inner sidewall of the heating housing and the heating lamp, which blocks radiant energy from the heating lamp transferred to the inner sidewall of the heating housing and reflects the radiant energy.

25. The heating apparatus of claim 23 wherein the window diffusion plate comprises
an upper plate having upper through-holes formed therein;

a lower plate having lower through-holes formed at positions faced with the upper through-holes and spaced apart from the upper plate;

the unit window placed between the upper plate and the lower plate; and a cooling member provided between the upper plate and the lower plate at an area without the upper and lower through-holes.

26. The heating apparatus of claim 25 wherein the unit window scatters radiant energy transferred from the heating housing and transmits the scattered radiant energy to the substrate.

27. The heating apparatus of claim 26 wherein the unit window has unevenness on a surface thereof to scatter incident radiant energy.

* * * * *